(12) United States Patent
Hui et al.

(10) Patent No.: US 11,632,138 B2
(45) Date of Patent: Apr. 18, 2023

(54) UPO COMPLIANT INFORMATION SEQUENCES FOR POLAR CODES

(71) Applicant: TELEFONAKTIEBOLAGET L M ERICSSON (PUBL), Stockholm (SE)

(72) Inventors: Dennis Hui, Sunnyvale, CA (US); Yufei Blankenship, Kildeer, IL (US); Michael Breschel, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 394 days.

(21) Appl. No.: 16/640,918

(22) PCT Filed: Feb. 21, 2018

(86) PCT No.: PCT/IB2018/056323
§ 371 (c)(1),
(2) Date: Feb. 21, 2020

(87) PCT Pub. No.: WO2019/038677
PCT Pub. Date: Feb. 28, 2019

(65) Prior Publication Data
US 2021/0135689 A1      May 6, 2021

Related U.S. Application Data

(60) Provisional application No. 62/548,237, filed on Aug. 21, 2017.

(51) Int. Cl.
*H03M 13/00* (2006.01)
*H03M 13/13* (2006.01)

(52) U.S. Cl.
CPC ....... *H03M 13/6577* (2013.01); *H03M 13/13* (2013.01)

(58) Field of Classification Search
CPC .......................... H03M 13/6577; H03M 13/13
See application file for complete search history.

(56) References Cited

U.S. PATENT DOCUMENTS

| | | | |
|---|---|---|---|
| 10,243,592 B2 * | 3/2019 | Li | H03M 13/616 |
| 2014/0019820 A1 * | 1/2014 | Vardy | H03M 13/13 |
| | | | 714/752 |

(Continued)

FOREIGN PATENT DOCUMENTS

| | | |
|---|---|---|
| CN | 107592181 A | 1/2018 |
| WO | 2017/106246 A2 | 6/2017 |

OTHER PUBLICATIONS

Qualcomm Inc., "Evaluation of the Sequence for Polar Codes", 3GPP TSG-RAN WG1 #90, R1-1713469, Aug. 21-25, 2017, Prague, Czech Republic, XPD51328057, 12 pages.

(Continued)

*Primary Examiner* — Esaw T Abraham
(74) *Attorney, Agent, or Firm* — Sage Patent Group

(57) ABSTRACT

According to some embodiments, a method of operation of a transmit node in a wireless communication system comprises performing polar encoding of a set of K information bits to thereby generate a set of polar-encoded information bits. The K information bits are mapped to the first K bit locations in an information sequence $S_N$. The information sequence $S_N$ is a ranked sequence of N information bit locations among a plurality of input bits for the polar encoding where N is equivalent to a code length. A size of the information sequence $S_N$ is greater than or equal to K. The information sequence $S_N$ is optimized for the specific value of the code length (N). The method may further comprise transmitting the set of polar-encoded information bits.

15 Claims, 8 Drawing Sheets

(56) References Cited

U.S. PATENT DOCUMENTS

| | | | |
|---|---|---|---|
| 2017/0047947 A1* | 2/2017 | Hong | H03M 13/2906 |
| 2018/0248654 A1* | 8/2018 | Ge | H03M 13/13 |
| 2020/0177309 A1* | 6/2020 | Jang | H03M 13/036 |
| 2020/0235754 A1* | 7/2020 | Hui | H03M 13/13 |

OTHER PUBLICATIONS

Qualcomm Inc., "Evaluation of the Sequence for Polar Codes", 3GPP TSG-RAN W61 #90, R1-1713469, Aug. 21-25, 2017, Prague, Czech Republic, XP051316270, 12 pages.

PCT International Search Report and Written Opinion for International Application PCT/IB2018/056323 dated Nov. 6, 2018, 12 pages.

Tal, Ido et al., "List Decoding of Polar Codes", IEEE Transactions on Information Theory, La Jolla, CA, USA, 11 pages.

Leroux, Camille et al., "A Semi-Parallel Successive-Cancellation Decoder for Polar Codes", IEEE Transactions on Signal Processing, Montréal, Québec, Canada, 10 pages.

Arikan, Erdal et al., "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

\* cited by examiner

*Example of polar code structure with N = 8*

Polar code encoder with N = 8

UPO COMPLIANT INFORMATION SEQUENCES FOR POLAR CODES

CROSS-REFERENCE TO RELATED APPLICATIONS

This application is a 371 of International Application No. PCT/IB2018/056323, filed Aug. 21, 2018, which claims the benefit of U.S. Provisional Application No. 62/548,237, filed Aug. 21, 2017, the disclosures of which are fully incorporated herein by reference.

TECHNICAL FIELD

Particular embodiments are directed to wireless communications and, more particularly, to universal partial ordering (UPO) compliant information sequences for polar codes.

INTRODUCTION

Polar codes, proposed by E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009, are a class of constructive coding schemes that achieve the symmetric capacity of the binary-input discrete memoryless channels under a low-complexity Successive Cancellation (SC) decoder. The finite-length performance of polar codes under SC, however, is not competitive compared to other modern channel coding schemes such as Low-Density Parity-Check (LDPC) codes and Turbo codes. An SC List (SCL) decoder is proposed in I. Tal and A. Vardy, "List Decoding of polar codes," Proceedings of IEEE Symp. Inf. Theory, pp. 1-5, 2011, that approaches the performance of optimal Maximum-Likelihood (ML) decoder. By concatenating a simple Cyclic Redundancy Check (CRC) coding, the performance of a concatenated polar code is competitive with that of well-optimized LDPC and Turbo codes. As a result, polar codes are being considered as a candidate for future Fifth Generation (5G) wireless communication systems.

Polar coding transforms a pair of identical binary-input channels into two distinct channels of different qualities, one better and one worse than the original binary-input channel. Repeating such a pair-wise polarizing operation on a set of $N=2^n$ independent uses of a binary-input channel results in a set of $2^n$ "bit-channels" of varying qualities. Some of the bit channels are nearly perfect (i.e., error free) while the rest of them are nearly useless (i.e., totally noisy). Polar coding uses the nearly perfect channel to transmit data to the receiver and sets the input to the useless channels to have fixed or frozen values (e.g., 0) known to the receiver. For this reason, the input bits to the nearly useless and the nearly perfect channel are commonly referred to as frozen bits and non frozen (or information) bits, respectively. Only the non-frozen bits are used to carry data in a polar code. Loading the data into the proper information bit locations has direct impact on the performance of a polar code. The set of information bit locations is commonly referred to as an information set. An illustration of the structure of a length-8 polar code is illustrated in FIG. 1.

In general, the set of information bit locations varies with the number of channel uses, or equivalently the code length, N, as well as the number of data bits, or equivalently the number of information bit locations, K. However, with the commonly used Additive White Gaussian Noise (AWGN) channel model, for any code length N, if $K_1 < K_2$, then the information set $A_1$ with $K_1$ information bit locations is always a (proper) subset of the information set $A_2$ with $K_2$ information bit locations. As a result, with an AWGN channel, for any given code length N, the information sets for all possible number of information bit locations, K, may be specified by a ranking sequence $S_N$ of bit location indices of length N so that the first K indices in $S_N$ is the set of information bit locations if there are K data bits, for any $K \in \{1, 2, \ldots, N\}$. Such a ranking sequence $S_N$ is referred to as the information sequence, from which the locations of bit-channels for carrying any number of data bits K can be derived.

FIG. 2 illustrates the labeling of the intermediate information bits $s_{l,i}$, where $l \in \{0, 1, \ldots, n\}$ and $i \in \{0, 1, \ldots, N-1\}$ during polar encoding with $N=8$. The intermediate information bits are related by the following equation:

$$s_{l+1,i} = s_{l,i} \oplus s_{l,i+2^l}, \text{ for}$$

$$i \in \left\{ j \in \{0, 1, \ldots, N-1\} : \text{mod}\left(\left\lfloor \frac{j}{2^l} \right\rfloor, 2\right) = 0 \right\} \text{ and}$$

$$l \in \{0, 1, \ldots, n-1\}, \text{ and}$$

$$s_{l+1,i+2^l} = s_{l,i+2^l}, \text{ for}$$

$$i \in \left\{ j \in \{0, 1, \ldots, N-1\} : \text{mod}\left(\left\lfloor \frac{j}{2^l} \right\rfloor, 2\right) = 0 \right\} \text{ and}$$

$$l \in \{0, 1, \ldots, n-1\}$$

where $s_{0,i} \equiv u_i$ are the information bits and $s_{n,i} \equiv x_i$ are the code bits for $i \in \{0, 1, \ldots, N-1\}$.

SUMMARY

A main design issue of polar coding is to identify the information sequence from which the locations of bit-channels for carrying K data bits can be obtained for a given code length N. Huawei, HiSilicon, "Polar code design and rate matching," 3GPP contribution R1-167209, September 2016 proposes that such an information sequence can be obtained by assigning a weight for each bit channel indexed by j based on the following polarization weight function:

$$W(j) = \sum_{i=0}^{n-1} b_i \beta^i$$

where $$\beta = 2^{\frac{1}{4}} \text{ and } j = \sum_{i=0}^{n-1} b_i 2^i$$

is the binary expansion of the bit-channel index j. The information sequence is obtained simply by sorting values of $W(i)$ for $i \in \{0, 1, 2, \ldots, 2^n\}$. This information sequence is referred to as the Polarization Weight (PW) sequence.

One problem with the PW sequence is that it imposes an artificial relationship among the relative reliabilities of different bit channels as dictated by the PW function. Moreover, the value of the weight $\beta$ is derived assuming an SC decoder instead of an SCL decoder, which is more commonly used in practice.

In this disclosure, information sequences that are numerically optimized for some specific code length N are presented. The optimization accounts for the performance of SCL decoders of different list sizes at different operating levels of Block Error Rate (BLER) (e.g., BLER=1% or 0.1%).

According to some embodiments, a method of operation of a transmit node in a wireless communication system comprises performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise transmitting the set of polar-encoded information bits.

According to some embodiments, a transmit node comprises a polar encoder operable to perform polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The transmit node may further comprises a transmitter operable to transmit the set of polar-encoded information bits.

According to some embodiments, a method of operation of a receive node in a wireless communication system comprises performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The method may further comprise receiving the set of polar-encoded information bits.

According to some embodiments, a receive node comprises a polar decoder operable to perform polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N). The receive node may further comprise a receiver operable to receive the set of polar-encoded information bits.

Also disclosed is a computer program product. The computer program product comprises instructions stored on non-transient computer-readable media which, when executed by a processor, perform the step of performing polar encoding of a set of K information bits to thereby generate a set of polar-encoded information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

Another computer program product comprises instructions stored on non-transient computer-readable media which, when executed by a processor, perform the step of performing polar decoding of a set of polar encoded information bits to thereby generate a set of K information bits. The K information bits are mapped to the first K bit locations in an information sequence SN. The information sequence SN is a ranked sequence of N information bit locations among a plurality of input bits for the polar encoding where N is equivalent to a code length. A size of the information sequence SN is greater than or equal to K. The information sequence SN is optimized for the specific value of the code length (N).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

BRIEF DESCRIPTION OF THE DRAWINGS

The accompanying drawing figures, incorporated in and forming a part of this specification, illustrate several aspects of the disclosure, and together with the description form a more complete understanding of the embodiments and their features and advantages.

DETAILED DESCRIPTION

Figure 1:
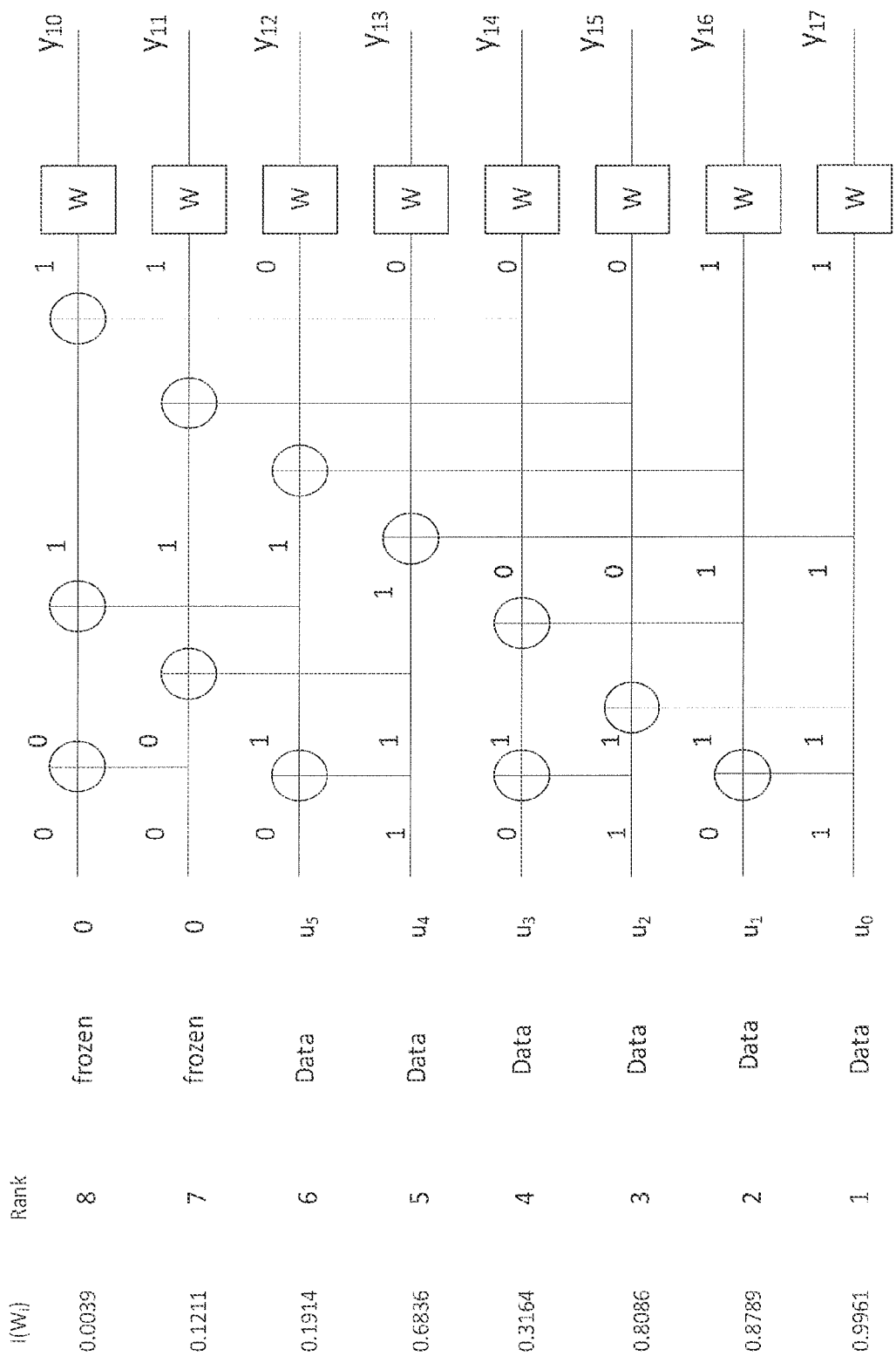
FIG. 1 illustrates an example of a polar code structure with N=8.
Figure 2:
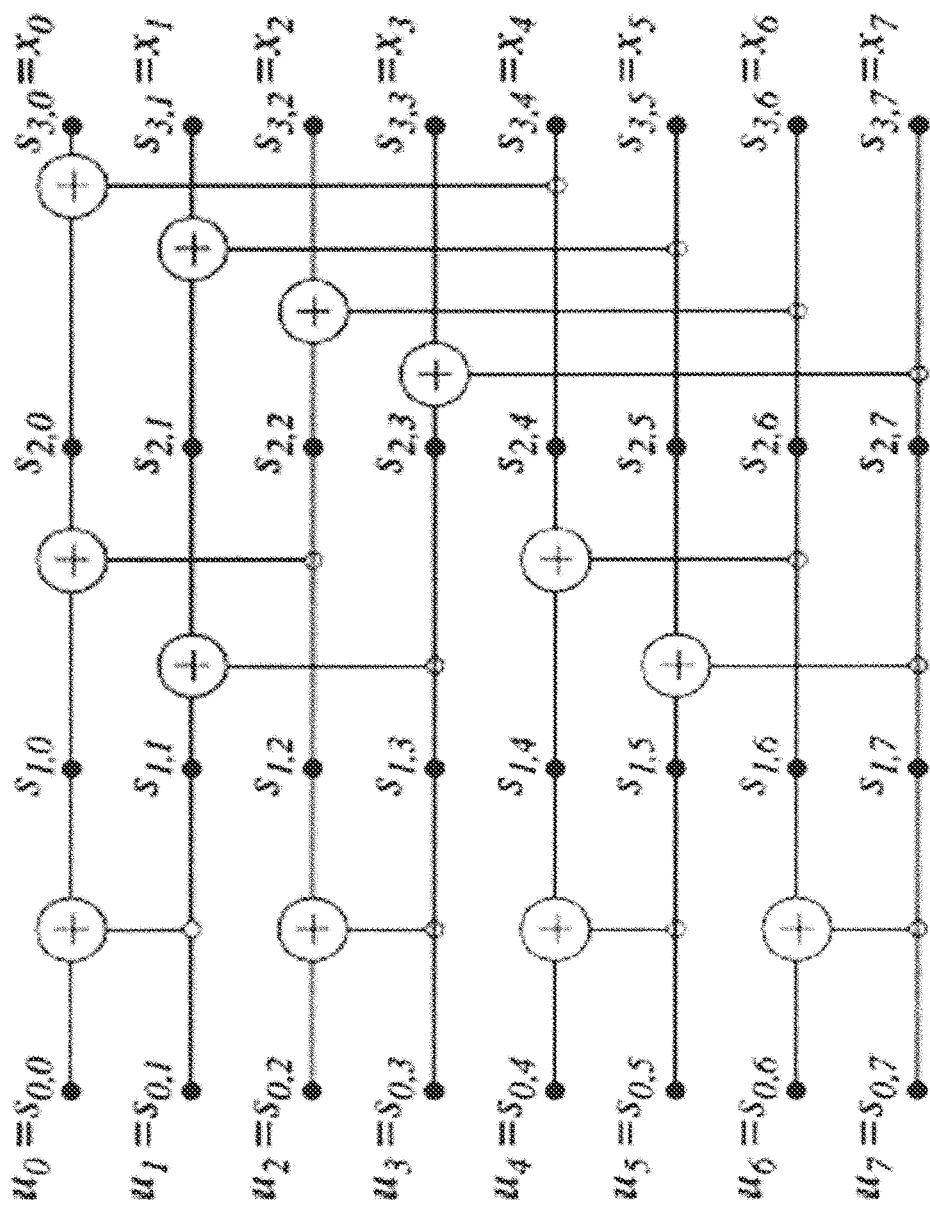
FIG. 2 illustrates labelling of intermediate bits in a polar code encoder with N=8.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) 5G NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

Systems and methods are disclosed herein relating to polar codes and the use thereof in a wireless communications system.

In this disclosure, information sequences that are numerically optimized for some specific code length N are presented. The optimization is done in such a way that accounts for the performance of SCL decoders of different list sizes at different operating levels of BLER (e.g., BLER=1% or 0.1%).

A key advantage of the proposed information sequences is that they generally yield better performance for the code lengths that they are designed for compared to the PW sequence because they are individually optimized.

In general, the disclosed embodiments include sets of information sequences that are individually optimized for a set of specific code block lengths.

Listed below are length-1024 sequences that perform well with a SCL decoder and a SC decoder in practice. Note that it should be clear to those skilled in the art that a subsequence (or part) of each of these sequences may be extracted and used in a SCL decoder to perform polar decoding while discarding the rest of the sequence. For example, a sequence of length N=512 may be obtained by deleting elements with indices larger or equal to 512 for the length 1024 sequence. The sequence is written in the format of highest reliability to lowest reliability.

Listed below are length-1024 sequences that perform well with an SCL decoder and an SC decoder in practice.

a) $S_{1024}^1$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 501 881 760 743 933 494 921 874 918 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932 635 471 445 742 880 498 730 851 822 382 920 845 741 443 700 729 631 492 872 961 726 821 930 497 381 843 463 916 739 671 623 490 929 439 814 819 868 752 914 698 725 839 856 476 813 718 908 486 723 866 489 607 431 697 379 811 798 913 575 717 254 694 636 474 807 715 906 797 693 865 960 852 744 634 473 795 905 485 415 483 470 444 375 850 740 686 902 824 691 253 711 633 844 685 630 901 367 791 928 728 820 849 783 670 899 738 842 683 251 469 442 441 462 247 737 438 467 351 629 841 724 679 669 496 461 818 380 437 627 622 459 378 239 488 667 838 430 484 812 621 319 817 435 377 696 722 912 606 810 864 716 837 721 714 809 796 455 472 619 835 692 663 223 414 904 429 806 482 632 713 690 848 605 374 252 794 427 710 684 615 805 900 655 468 373 603 413 574 481 371 250 793 466 423 366 689 628 440 365 709 790 803 411 573 682 249 460 789 668 599 350 707 246 681 465 571 626 436 407 782 191 127 363 620 666 458 245 349 678 434 677 591 787 399 457 359 238 625 840 567 736 665 428 376 781 898 618 675 318 454 662 243 897 347 836 816 720 433 604 617 779 808 661 834 712 804 833 559 237 453 426 222 317 775 372 343 412 235 543 614 451 425 422 613 370 221 315 480 335 659 654 364 190 369 248 653 688 231 410 602 611 802 792 421 651 601 598 708 311 219 572 597 788 570 409 590 362 801 680 464 406 419 348 647 786 215 589 706 361 676 566 189 595 244 569 303 405 358 456 346 398 565 242 126 705 780 587 624 664 236 187 357 432 785 558 674 207 403 397 452 345 563 778 241 316 342 616 660 557 125 234 183 287 355 583 673 395 424 314 220 777 341 612 658 123 175 774 555 233 334 542 450 313 391 230 652 368 218 339 600 119 333 657 610 773 541 310 420 159 229 650 551 596 609 408 217 449 188 309 214 331 111 539 360 771 649 302 418 594 896 227 404 646 186 588 832 568 213 417 301 307 356 402 800 564 327 95 206 240 535 593 645 586 344 396 185 401 211 354 299 585 286 562 643 182 205 124 232 285 295 181 556 582 527 394 340 63 203 561 353 704 122 283 393 581 554 174 390 448 312 338 228 179 784 199 553 121 173 389 540 579 332 118 672 550 337 158 279 271 416 216 308 387 538 549 226 330 776 171 212 117 110 329 656 157 772 306 326 225 167 115 537 534 184 109 300 547 305 210 155 533 325 608 352 400 298 204 94 648 284 209 151 180 107 770 297 392 323 592 202 644 93 294 178 103 143 282 62 336 201 120 172 198 769 584 91 388 293 177 526 278 281 642 525 531 61 170 116 197 87 156 277 114 560 169 59 291 580 275 523 641 270 195 552 519 166 224 578 108 269 79

154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 22 37 80 513 25 258 35 132 21 257
72 14 48 13 19 130 68 40 11 512 66 129 7 36 24 34 256
20 65 33 12 128 18 10 17 6 9 64 5 3 32 16 8 4 2 1 0]

b) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232

285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 22 37 80 513 25 258 35 132 21 257
72 14 48 13 19 130 68 40 11 512 66 129 7 36 24 34 256
20 65 33 12 128 18 10 17 6 9 64 5 3 32 16 8 4 2 1 0]

c) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786

215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 22 37 80 513 25 258 35 132 21 257
72 14 48 13 19 130 68 40 11 512 66 129 7 36 24 34 256
20 65 33 12 128 18 10 17 6 9 64 5 3 32 16 8 4 2 1 0]

d) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900

655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 22 37 80 513 25 258 35 132 21 257
72 14 48 13 19 130 68 40 11 512 66 129 7 36 24 34 256
20 65 33 12 128 18 10 17 6 9 64 5 3 32 16 8 4 2 1 0]

e) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914

698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 70 544 192 528
288 520 160 272 73 49 516 42 69 28 144 41 67 96 514
38 264 260 136 26 22 37 80 513 25 258 35 132 21 257
72 14 48 13 19 130 68 40 11 512 66 129 7 36 24 34 256
20 65 33 12 128 18 10 17 6 9 64 5 3 32 16 8 4 2 1 0]

f) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969

750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 70 544 192 528
288 520 160 272 73 49 516 42 69 28 144 41 67 96 514
38 264 260 136 26 22 37 80 513 25 258 35 132 21 257

72 14 48 13 19 130 68 40 11 512 66 129 7 36 24 34 256
20 65 33 12 128 18 10 17 6 9 64 5 3 32 16 8 4 2 1 0]

g) $S_{1024}^{1}$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 50 74 131 44 70 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

h) $S_{1024}^{1}$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396

185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 50 74 131 44 70 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

i) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

j) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435

377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

k) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853

475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

l) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982

981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

m) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298

204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

n) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334

542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

o) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399

457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

p) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485

415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

q) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937

882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

r) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263

532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

s) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704

122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

t) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786

215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 22 37 80 513 25 258 35 132 21
257 72 14 48 13 19 130 68 40 11 512 66 129 7 36 24
34 256 20 65 33 12 128 18 10 17 6 9 64 5 3 32 16 8
4 2 1 0]

u) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632

713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 25 37 80 513 22 258 35 132 21 257
72 14 48 13 19 130 68 40 11 512 66 129 7 36 24 34 256
20 65 33 12 128 18 10 17 6 9 64 5 3 32 16 8 4 2 1 0]

v) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843

463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 25 37 80 513 22 258 35 132 21 257
72 14 48 13 19 130 68 40 11 512 66 129 7 36 24 34 256
20 65 33 12 128 18 10 17 6 9 64 5 3 32 16 8 4 2 1 0]
w) $S_{1024}{}^1$=[1023 1022 1021 1019 1015 1007 1020 991
1018 1017 1014 1006 959 1013 1011 895 1005 990 1003
989 767 1016 999 1012 987 958 983 957 1010 1004 955
1009 894 975 893 1002 951 1001 988 511 766 998 891 943
986 997 985 887 956 765 995 927 982 981 879 954 974 763
953 979 510 1008 759 863 950 892 1000 973 949 509 890
971 996 942 751 984 889 507 947 831 886 967 941 764 926
980 994 939 885 993 735 878 925 503 762 883 978 935 703
495 952 877 761 972 923 977 948 758 862 875 919 970 757

861 508 969 750 946 479 888 639 871 911 830 940 859 755
966 945 749 506 884 938 965 829 734 924 855 505 747 963
937 882 934 827 733 447 992 847 876 502 922 702 494 881
760 743 933 501 921 874 918 823 731 499 860 756 931 701
873 493 727 917 870 976 815 910 383 968 478 858 754 699
491 869 944 748 638 915 477 719 909 964 255 799 504 857
854 753 828 746 695 487 907 637 867 853 475 936 962 446
732 826 745 846 500 825 903 687 932 635 471 445 742 880
498 730 851 822 382 920 845 741 443 700 729 631 492 872
961 726 821 930 497 381 843 463 916 739 671 623 490 929
439 814 819 868 752 914 698 725 839 856 476 813 718 908
486 723 866 489 607 431 697 379 811 798 913 575 717 254
694 636 474 807 715 906 797 693 865 960 852 744 634 473
795 905 485 415 483 470 444 375 850 740 686 902 824 691
253 711 633 844 685 630 901 367 791 928 728 820 849 783
670 899 738 842 683 251 469 442 441 462 247 737 438 467
351 629 841 724 679 669 496 461 818 380 437 627 622 459
378 239 488 667 838 430 484 812 621 319 817 435 377 696
722 912 606 810 864 716 837 721 714 809 796 455 472 619
835 692 663 223 414 904 429 806 482 632 713 690 848 605
374 252 794 427 710 684 615 805 900 655 468 373 603 413
574 481 371 250 793 466 423 366 689 628 440 365 709 790
803 411 573 682 249 460 789 668 599 350 707 246 681 465
571 626 436 407 782 191 127 363 620 666 458 245 349 678
434 677 591 787 399 457 359 238 625 840 567 736 665 428
376 781 898 618 675 318 454 662 243 897 347 836 816 720
433 604 617 779 808 661 834 712 804 833 559 237 453 426
222 317 775 372 343 412 235 543 614 451 425 422 613 370
221 315 480 335 659 654 364 190 369 248 653 688 231 410
602 611 802 792 421 651 601 598 708 311 219 572 597 788
570 409 590 362 801 680 464 406 419 348 647 786 215 589
706 361 676 566 189 595 244 569 303 405 358 456 346 398
565 242 126 705 780 587 624 664 236 187 357 432 785 558
674 207 403 397 452 345 563 778 241 316 342 616 660 557
125 234 183 287 355 583 673 395 424 314 220 777 341 612
658 123 175 774 555 233 334 542 450 313 391 230 652 368
218 339 600 119 333 657 610 773 541 310 420 159 229 650
551 596 609 408 217 449 188 309 214 331 111 539 360 771
649 302 418 594 896 227 404 646 186 588 832 568 213 417
301 307 356 402 800 564 327 95 206 240 535 593 645 586
344 396 185 401 211 354 299 585 286 562 643 182 205 124
232 285 295 181 556 582 527 394 340 63 203 561 353 704
122 283 393 581 554 174 390 448 312 338 228 179 784 199
553 121 173 389 540 579 332 118 672 550 337 158 279 271
416 216 308 387 538 549 226 330 776 171 212 117 110 329
656 157 772 306 326 225 167 115 537 534 184 109 300 547
305 210 155 533 325 608 352 400 298 204 94 648 284 209
151 180 107 770 297 392 323 592 202 644 93 294 178 103
143 282 62 336 201 120 172 198 769 584 91 388 293 177
526 278 281 642 525 531 61 170 116 197 87 156 277 114
560 169 59 291 580 275 523 641 270 195 552 519 166 224
578 108 269 79 154 113 548 577 536 328 55 106 165 153
150 386 208 324 546 385 267 47 92 163 304 296 105 102
149 263 532 322 292 545 90 200 31 321 530 142 176 147
101 141 196 524 529 290 89 280 60 86 99 139 168 58 522
276 85 194 289 78 135 112 521 57 83 54 518 274 268 768
164 77 152 193 53 162 104 517 273 266 75 46 148 51 640
100 45 576 161 265 262 71 146 30 140 88 515 98 43 29 261
145 138 84 259 39 97 27 56 82 137 76 384 134 23 52 133
320 15 81 74 131 44 73 544 192 528 288 520 160 272 70
49 516 42 69 28 144 41 67 96 514 38 264 260 136 26 25 37
80 513 22 258 35 132 21 257 72 14 48 13 19 130 68 40 11
512 66 129 7 36 24 34 256 20 65 33 12 128 18 10 17 6 9
64 5 3 32 16 8 4 2 1 0]
x) $S_{1024}{}^1$=[1023 1022 1021 1019 1015 1007 1020 991
1018 1017 1014 1006 959 1013 1011 895 1005 990
1003 989 767 1016 999 1012 987 958 983 957 1010

1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 510 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268

768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 73 544 192 528
288 520 160 272 70 49 516 42 69 28 144 41 67 96 514
38 264 260 136 26 25 37 80 513 22 258 35 132 21 257
72 14 48 13 19 130 68 40 11 512 66 129 7 36 24 34 256
20 65 33 12 128 18 10 17 6 9 64 5 3 32 16 8 4 2 1 0]
 y) $S_{1024}^1$=[1023 1022 1021 1019 1015 1007 1020 991
1018 1017 1014 1006 959 1013 1011 895 1005 990 1003
989 767 1016 999 1012 987 958 983 957 1010 1004 955
1009 894 975 893 1002 951 1001 988 511 766 998 891 943
986 997 985 887 956 765 995 927 982 981 879 954 974 763
953 979 510 1008 759 863 950 892 1000 973 949 509 890
971 996 942 751 984 889 507 947 831 886 967 941 764 926
980 994 939 885 993 735 878 925 503 762 883 978 935 703
495 952 877 761 972 923 977 948 758 862 875 919 970 757
861 508 969 750 946 479 888 639 871 911 830 940 859 755
966 945 749 506 884 938 965 829 734 924 855 505 747 963
937 882 934 827 733 447 992 847 876 502 922 702 501 881
760 743 933 494 921 874 918 823 731 499 860 756 931 701
873 493 727 917 870 976 815 910 383 968 478 858 754 699
491 869 944 748 915 477 719 909 964 255 799 504 857
854 753 828 746 695 487 907 637 867 853 475 936 962 446
732 826 745 846 500 825 903 687 932 635 471 445 742 880
498 730 851 822 382 920 845 741 443 700 729 631 492 872
961 726 821 930 497 381 843 463 916 739 671 623 490 929
439 814 819 868 752 914 698 725 839 856 476 813 718 908
486 723 866 489 607 431 697 379 811 798 913 575 717 254
694 636 474 807 715 906 797 693 865 960 852 744 634 473
795 905 485 415 483 470 444 375 850 740 686 902 824 691
253 711 633 844 685 630 901 367 791 928 728 820 849 783
670 899 738 842 683 251 469 442 441 462 247 737 438 467
351 629 841 724 679 669 496 461 818 380 437 627 622 459
378 239 488 667 838 430 484 812 621 319 817 435 377 696
722 912 606 810 864 716 837 721 714 809 796 455 472 619
835 692 663 223 414 904 429 806 482 632 713 690 848 605
374 252 794 427 710 684 615 805 900 655 468 373 603 413
574 481 371 250 793 466 423 366 689 628 440 365 709 790
803 411 573 682 249 460 789 668 599 350 707 246 681 465
571 626 436 407 782 191 127 363 620 666 458 245 349 678
434 677 591 787 399 457 359 238 625 840 567 736 665 428
376 781 898 618 675 318 454 662 243 897 347 836 816 720
433 604 617 779 808 661 834 712 804 833 559 237 453 426
222 317 775 372 343 412 235 543 614 451 425 422 613 370
221 315 480 335 659 654 364 190 369 248 653 688 231 410
602 611 802 792 421 651 601 598 708 311 219 572 597 788
570 409 590 362 801 680 464 406 419 348 647 786 215 589
706 361 676 566 189 595 244 569 303 405 358 456 346 398
565 242 126 705 780 587 624 664 236 187 357 432 785 558
674 207 403 397 452 345 563 778 241 316 342 616 660 557
125 234 183 287 355 583 673 395 424 314 220 777 341 612
658 123 175 774 555 233 334 542 450 313 391 230 652 368
218 339 600 119 333 657 610 773 541 310 420 159 229 650
551 596 609 408 217 449 188 309 214 331 111 539 360 771
649 302 418 594 896 227 404 646 186 588 832 568 213 417
301 307 356 402 800 564 327 95 206 240 535 593 645 586
344 396 185 401 211 354 299 585 286 562 643 182 205 124
232 285 295 181 556 582 527 394 340 63 203 561 353 704
122 283 393 581 554 174 390 448 312 338 228 179 784 199
553 121 173 389 540 579 332 118 672 550 337 158 279 271
416 216 308 387 538 549 226 330 776 171 212 117 110 329
656 157 772 306 326 225 167 115 537 534 184 109 300 547
305 210 155 533 325 608 352 400 298 204 94 648 284 209
151 180 107 770 297 392 323 592 202 644 93 294 178 103
143 282 62 336 201 120 172 198 769 584 91 388 293 177
526 278 281 642 525 531 61 170 116 197 87 156 277 114

560 169 59 291 580 275 523 641 270 195 552 519 166 224
578 108 269 79 154 113 548 577 536 328 55 106 165 153
150 386 208 324 546 385 267 47 92 163 304 296 105 102
149 263 532 322 292 545 90 200 31 321 530 142 176 147
101 141 196 524 529 290 89 280 60 86 99 139 168 58 522
276 85 194 289 78 135 112 521 57 83 54 518 274 268 768
164 77 152 193 53 162 104 517 273 266 75 46 148 51 640
100 45 576 161 265 262 71 146 30 140 88 515 98 43 29 261
145 138 84 259 39 97 27 56 82 137 76 384 134 23 52 133
320 15 81 74 131 44 70 544 192 528 288 520 160 272 73
49 516 42 69 28 144 41 67 96 514 38 264 260 136 26 25 37
80 513 22 258 35 132 21 257 72 14 48 13 19 130 68 40 11
512 66 129 7 36 24 34 256 20 65 33 12 128 18 10 17 6 9
64 5 3 32 16 8 4 2 1 0]

z) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396

185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 70 544 192 528
288 520 160 272 73 49 516 42 69 28 144 41 67 96 514
38 264 260 136 26 25 37 80 513 22 258 35 132 21 257
72 14 48 13 19 130 68 40 11 512 66 129 7 36 24 34 256
20 65 33 12 128 18 10 17 6 9 64 5 3 32 16 8 4 2 1 0]

aa) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597

788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 70 544 192 528
288 520 160 272 73 49 516 42 69 28 144 41 67 96 514
38 264 260 136 26 25 37 80 513 22 258 35 132 21 257
72 14 48 13 19 130 68 40 11 512 66 129 7 36 24 34 256
20 65 33 12 128 18 10 17 6 9 64 5 3 32 16 8 4 2 1 0]

bb) $S_{1024}{}^{1}$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632

713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 81 74 131 44 70 544 192 528
288 520 160 272 73 49 516 42 69 28 144 41 67 96 514
38 264 260 136 26 25 37 80 513 22 258 35 132 21 257
72 14 48 13 19 130 68 40 11 512 66 129 7 36 24 34 256
20 65 33 12 128 18 10 17 6 9 64 5 3 32 16 8 4 2 1 0]

cc) $S_{1024}{}^{1}$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843

463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

dd) $S_{1024}^{1}$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993

735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96

514 38 264 260 136 26 25 37 80 513 22 258 35 132 21 257 72 14 48 13 19 130 68 40 11 512 66 129 7 36 24 34 256 20 65 33 12 128 18 10 17 6 9 64 5 3 32 16 8 4 2 1 0]

ee) $S_{1024}^{1}$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 494 881 760 743 933 501 921 874 918 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932 635 471 445 742 880 498 730 851 822 382 920 845 741 443 700 729 631 492 872 961 726 821 930 497 381 843 463 916 739 671 623 490 929 439 814 819 868 752 914 698 725 839 856 476 813 718 908 486 723 866 489 607 431 697 379 811 798 913 575 717 254 694 636 474 807 715 906 797 693 865 960 852 744 634 473 795 905 485 415 483 470 444 375 850 740 686 902 824 691 253 711 633 844 685 630 901 367 791 928 728 820 849 783 670 899 738 842 683 251 469 442 441 462 247 737 438 467 351 629 841 724 679 669 496 461 818 380 437 627 622 459 378 239 488 667 838 430 484 812 621 319 817 435 377 696 722 912 606 810 864 716 837 721 714 809 796 455 472 619 835 692 663 223 414 904 429 806 482 632 713 690 848 605 374 252 794 427 710 684 615 805 900 655 468 373 603 413 574 481 371 250 793 466 423 366 689 628 440 365 709 790 803 411 573 682 249 460 789 668 599 350 707 246 681 465 571 626 436 407 782 191 127 363 620 666 458 245 349 678 434 677 591 787 399 457 359 238 625 840 567 736 665 428 376 781 898 618 675 318 454 662 243 897 347 836 816 720 433 604 617 779 808 661 834 712 804 833 559 237 453 426 222 317 775 372 343 412 235 543 614 451 425 422 613 370 221 315 480 335 659 654 364 190 369 248 653 688 231 410 602 611 802 792 421 651 601 598 708 311 219 572 597 788 570 409 590 362 801 680 464 406 419 348 647 786 215 589 706 361 676 566 189 595 244 569 303 405 358 456 346 398 565 242 126 705 780 587 624 664 236 187 357 432 785 558 674 207 403 397 452 345 563 778 241 316 342 616 660 557 125 234 183 287 355 583 673 395 424 314 220 777 341 612 658 123 175 774 555 233 334 542 450 313 391 230 652 368 218 339 600 119 333 657 610 773 541 310 420 159 229 650 551 596 609 408 217 449 188 309 214 331 111 539 360 771 649 302 418 594 896 227 404 646 186 588 832 568 213 417 301 307 356 402 800 564 327 95 206 240 535 593 645 586 344 396 185 401 211 354 299 585 286 562 643 182 205 124 232 285 295 181 556 582 527 394 340 63 203 561 353 704 122 283 393 581 554 174 390 448 312 338 228 179 784 199 553 121 173 389 540 579 332 118 672 550 337 158 279 271 416 216 308 387 538 549 226 330 776 171 212 117 110 329 656 157 772 306 326 225 167 115 537 534 184 109 300 547 305 210 155 533 325 608 352 400 298 204 94 648 284 209 151 180 107 770 297 392 323 592 202 644 93 294 178 103 143 282 62 336 201 120 172 198 769 584 91 388 293 177 526 278 281 642 525 531 61 170 116 197 87 156 277 114 560 169 59 291 580 275 523 641 270 195 552 519 166 224 578 108 269 79 154 113 548 577 536 328 55 106 165 153 150 386 208 324 546 385 267 47 92 163 304 296 105 102 149 263 532 322 292 545 90 200 31 321 530 142 176 147 101 141 196 524 529 290 89 280 60 86 99 139 168 58 522 276 85 194 289 78 135 112 521 57 83 54 518 274 268 768 164 77 152 193 53 162 104 517 273 266 75 46 148 51 640 100 45 576 161 265 262 71 146 30 140 88 515 98 43 29 261 145 138 84 259 39 97 27 56 82 137 76 384 134 23 52 133 320 15 74 50 81 131 44 73 544 192 528 288 520 160 272 70 49 516 42 69 28 144 41 67 96 514 38 264 260 136 26 25 37 80 513 22 258 35 132 21 257 72 14 48 13 19 130 68 40 11 512 66 129 7 36 24 34 256 20 65 33 12 128 18 10 17 6 9 64 5 3 32 16 8 4 2 1 0]

ff) $S_{1024}^{1}$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 494 881 760 743 933 501 918 874 921 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932 635 471 445 742 880 498 730 851 822 382 920 845 741 443 700 729 631 492 872 961 726 821 930 497 381 843 463 916 739 671 623 490 929 439 814 819 868 752 914 698 725 839 856 476 813 718 908 486 723 866 489 607 431 697 379 811 798 913 575 717 254 694 636 474 807 715 906 797 693 865 960 852 744 634 473 795 905 485 415 483 470 444 375 850 740 686 902 824 691 253 711 633 844 685 630 901 367 791 928 728 820 849 783 670 899 738 842 683 251 469 442 441 462 247 737 438 467 351 629 841 724 679 669 496 461 818 380 437 627 622 459 378 239 488 667 838 430 484 812 621 319 817 435 377 696 722 912 606 810 864 716 837 721 714 809 796 455 472 619 835 692 663 223 414 904 429 806 482 632 713 690 848 605 374 252 794 427 710 684 615 805 900 655 468 373 603 413 574 481 371 250 793 466 423 366 689 628 440 365 709 790 803 411 573 682 249 460 789 668 599 350 707 246 681 465 571 626 436 407 782 191 127 363 620 666 458 245 349 678 434 677 591 787 399 457 359 238 625 840 567 736 665 428 376 781 898 618 675 318 454 662 243 897 347 836 816 720 433 604 617 779 808 661 834 712 804 833 559 237 453 426 222 317 775 372 343 412 235 543 614 451 425 422 613 370 221 315 480 335 659 654 364 190 369 248 653 688 231 410 602 611 802 792 421 651 601 598 708 311 219 572 597 788 570 409 590 362 801 680 464 406 419 348 647 786 215 589 706 361 676 566 189 595 244 569 303 405 358 456 346 398 565 242 126 705 780 587 624 664 236 187 357 432 785 558 674 207 403 397 452 345 563 778 241 316 342 616 660 557 125 234 183 287 355 583 673 395 424 314 220 777 341 612 658 123 175 774 555 233 334 542 450 313 391 230 652 368 218 339 600 119 333 657 610 773 541 310 420 159 229 650 551 596 609 408 217 449 188 309 214 331 111 539 360 771 649 302 418 594

896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 73 544 192
528 288 520 160 272 70 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

gg) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317

775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

hh) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467

351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

ii) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858

754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

jj) $S_{1024}^1$=[1023 1022 1021 1019 1015 1007 1020 991
1018 1017 1014 1006 959 1013 1011 895 1005 990
1003 989 767 1016 999 1012 987 958 983 957 1010

1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268

768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

kk) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212

117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

ll) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 501 881
760 743 933 494 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241

316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

mm) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 921 874 918 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789

668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

nn) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969
750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607

431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 373 603 413 574 481 371 250 793 466 423 366
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 70 131 44 81 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

oo) $S_{1024}^1$=[1023 1022 1021 1019 1015 1007 1020 991
1018 1017 1014 1006 959 1013 1011 895 1005 990
1003 989 767 1016 999 1012 987 958 983 957 1010
1004 955 1009 894 975 893 1002 951 1001 988 511
766 998 891 943 986 997 985 887 956 765 995 927 982
981 879 954 974 763 953 979 510 1008 759 863 950
892 1000 973 949 509 890 971 996 942 751 984 889
507 947 831 886 967 941 764 926 980 994 939 885 993
735 878 925 503 762 883 978 935 703 495 952 877 761
972 923 977 948 758 862 875 919 970 757 861 508 969

750 946 479 888 639 871 911 830 940 859 755 966 945
749 506 884 938 965 829 734 924 855 505 747 963 937
882 934 827 733 447 992 847 876 502 922 702 494 881
760 743 933 501 918 874 921 823 731 499 860 756 931
701 873 493 727 917 870 976 815 910 383 968 478 858
754 699 491 869 944 748 638 915 477 719 909 964 255
799 504 857 854 753 828 746 695 487 907 637 867 853
475 936 962 446 732 826 745 846 500 825 903 687 932
635 471 445 742 880 498 730 851 822 382 920 845 741
443 700 729 631 492 872 961 726 821 930 497 381 843
463 916 739 671 623 490 929 439 814 819 868 752 914
698 725 839 856 476 813 718 908 486 723 866 489 607
431 697 379 811 798 913 575 717 254 694 636 474 807
715 906 797 693 865 960 852 744 634 473 795 905 485
415 483 470 444 375 850 740 686 902 824 691 253 711
633 844 685 630 901 367 791 928 728 820 849 783 670
899 738 842 683 251 469 442 441 462 247 737 438 467
351 629 841 724 679 669 496 461 818 380 437 627 622
459 378 239 488 667 838 430 484 812 621 319 817 435
377 696 722 912 606 810 864 716 837 721 714 809 796
455 472 619 835 692 663 223 414 904 429 806 482 632
713 690 848 605 374 252 794 427 710 684 615 805 900
655 468 366 603 413 574 481 373 250 793 466 423 371
689 628 440 365 709 790 803 411 573 682 249 460 789
668 599 350 707 246 681 465 571 626 436 407 782 191
127 363 620 666 458 245 349 678 434 677 591 787 399
457 359 238 625 840 567 736 665 428 376 781 898 618
675 318 454 662 243 897 347 836 816 720 433 604 617
779 808 661 834 712 804 833 559 237 453 426 222 317
775 372 343 412 235 543 614 451 425 422 613 370 221
315 480 335 659 654 364 190 369 248 653 688 231 410
602 611 802 792 421 651 601 598 708 311 219 572 597
788 570 409 590 362 801 680 464 406 419 348 647 786
215 589 706 361 676 566 189 595 244 569 303 405 358
456 346 398 565 242 126 705 780 587 624 664 236 187
357 432 785 558 674 207 403 397 452 345 563 778 241
316 342 616 660 557 125 234 183 287 355 583 673 395
424 314 220 777 341 612 658 123 175 774 555 233 334
542 450 313 391 230 652 368 218 339 600 119 333 657
610 773 541 310 420 159 229 650 551 596 609 408 217
449 188 309 214 331 111 539 360 771 649 302 418 594
896 227 404 646 186 588 832 568 213 417 301 307 356
402 800 564 327 95 206 240 535 593 645 586 344 396
185 401 211 354 299 585 286 562 643 182 205 124 232
285 295 181 556 582 527 394 340 63 203 561 353 704
122 283 393 581 554 174 390 448 312 338 228 179 784
199 553 121 173 389 540 579 332 118 672 550 337 158
279 271 416 216 308 387 538 549 226 330 776 171 212
117 110 329 656 157 772 306 326 225 167 115 537 534
184 109 300 547 305 210 155 533 325 608 352 400 298
204 94 648 284 209 151 180 107 770 297 392 323 592
202 644 93 294 178 103 143 282 62 336 201 120 172
198 769 584 91 388 293 177 526 278 281 642 525 531
61 170 116 197 87 156 277 114 560 169 59 291 580
275 523 641 270 195 552 519 166 224 578 108 269 79
154 113 548 577 536 328 55 106 165 153 150 386 208
324 546 385 267 47 92 163 304 296 105 102 149 263
532 322 292 545 90 200 31 321 530 142 176 147 101
141 196 524 529 290 89 280 60 86 99 139 168 58 522
276 85 194 289 78 135 112 521 57 83 54 518 274 268
768 164 77 152 193 53 162 104 517 273 266 75 46 148
51 640 100 45 576 161 265 262 71 146 30 140 88 515
98 43 29 261 145 138 84 259 39 97 27 56 82 137 76
384 134 23 52 133 320 15 74 50 81 131 44 70 544 192
528 288 520 160 272 73 49 516 42 69 28 144 41 67 96
514 38 264 260 136 26 25 37 80 513 22 258 35 132 21
257 72 14 48 13 19 130 68 40 11 512 66 129 7 36 24
34 256 20 65 33 12 128 18 10 17 6 9 64 5 3 32 16 8
4 2 1 0]

For example, if there are K=10 information bits, the information set A of size K=10 can be extracted from the a) sequence $S_{1024}^1$ above by taking the first K=10 indices of the sequence, i.e.

A={1023 1022 1021 1019 1015 1007 1020 991 1018 1017}.

The indices in A specify the information bit locations where the data bits should be loaded for the polar encoder, and they are also the location where the decoder should extract the data during an SC or SCL decoding process.

Those skilled in the art will understand that, in some cases, the ordering of some small sub-group of bits within the above sequences may be swapped for provide incremental improvement in performance at certain operating points.

Particular embodiments include a method for generating the sequences. At a first step, particular embodiments, find a good length 64 sequence. At a second step, particular embodiments search for a length 128 sequence with the constraint that the length 64 subset of the length 128 sequence is identical the length 64 sequence found in the first step.

At a third step, the universal partial ordering (UPO) described in "Construction of Polar Codes with Sublinear Complexity" by Marco Mondelli and "A Partial Order for the Synthesized Channels of a Polar Code" by Christian Schürch are used to further constrain the sequences. The two papers describe partial ordering of the sequences regardless of the radio channel that is used and is therefore a good property of the sequence to have. Furthermore, the partial ordering helps to constrain the sets of information bits and frozen bits in such a way that multi bit decoder can be implemented with less complex hardware.

Figure 3:
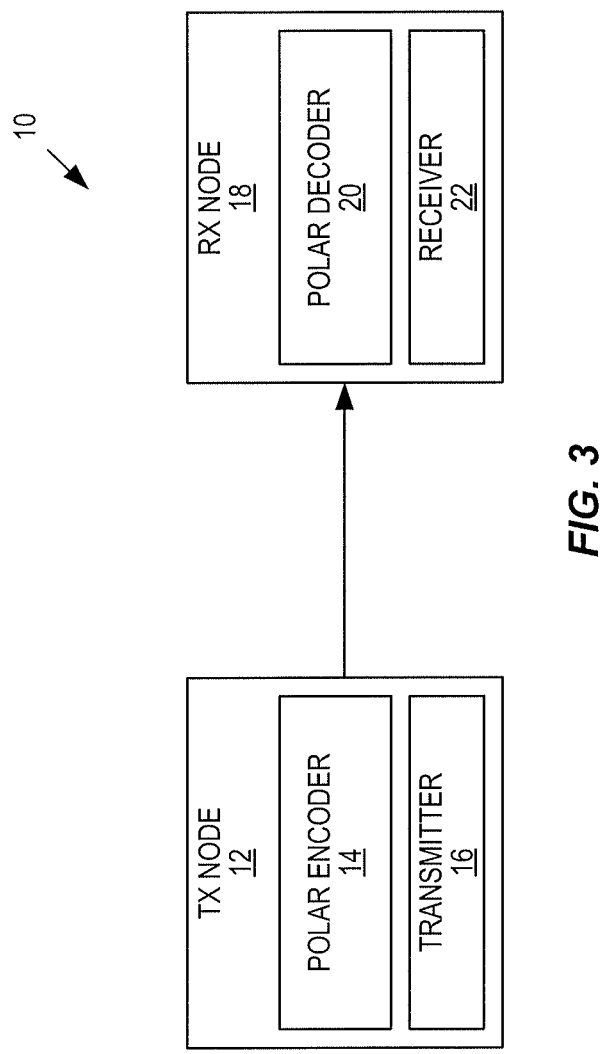
FIG. 3 illustrates one example of a system in which embodiments of the present disclosure may be implemented.

At a fourth step, the first and second steps are repeated until a sequence of the desired length is formed. Sequences of shorter length than 1024 can be derived by simple deletion of specific elements from the used $S_{1024}^1$. Example code is given below:

$S_{512}^1 = S_{1024}^1(\text{find}(S_{1024}^1 < 512))$;
$S_{256}^1 = S_{1024}^1(\text{find}(S_{1024}^1 < 256))$;
$S_{128}^1 = S_{1024}^1(\text{find}(S_{1024}^1 < 128))$;
$S_{64}^1 = S_{1024}^1(\text{find}(S_{1024}^1 < 64))$;

FIG. 3 illustrates a wireless communications system 10 including a transmit (TX) node 12 that includes a polar encoder 14 (i.e., a polar code encoder) and a transmitter 16, and a receive (RX) node 18 that includes a polar decoder 20 (i.e., a polar code decoder) and a receiver 22. The polar encoder 14 may be implemented in hardware or a combination of hardware and software (e.g., software stored on memory and executed by a processor(s)). The transmitter 16 includes various hardware components such as, e.g., Digital-to-Analog Converter(s) (DAC(s)), filter(s), mixer(s), amplifier(s), and/or the like. Likewise, the polar decoder 20 may be implemented in hardware or a combination of hardware and software (e.g., software stored on memory and executed by a processor(s)). The receiver 22 includes various hardware components such as, e.g., an Analog-to-Digital Converter(s) (ADC(s)), filter(s), mixer(s), amplifier(s), and/or the like. The wireless communications system 10 may be any type of wireless communications system such as, but not limited to, a cellular communications network in which the transmit node 12 is, e.g., a radio access node (e.g., a base station) and the receive node 18 is a wireless device or terminal (e.g., a UE), or vice versa.

Figure 4A:
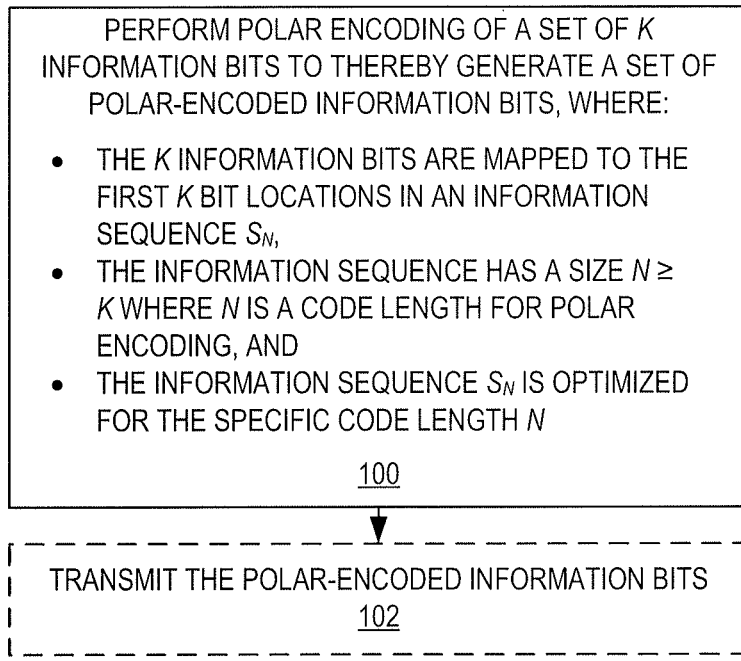
FIG. 4A is a flow chart that illustrates the operation of a transmit node in accordance with some embodiments of the present disclosure.

FIG. 4A is a flow chart that illustrates the operation of the transmit node 12 in accordance with some embodiments of the present disclosure. Optional steps are represented by a dashed box. As illustrated, the transmit node 12, and in particular the polar encoder 14, performs polar encoding of a set of K information bits to thereby generate a set of polar-encoded information bits (step 100). For polar encoding, there is a set of input bit locations for the polar encoder 14 consisting of K information bit (i.e., not frozen bit) locations and one or more non-information (i.e., frozen) bit locations, where N is the code length and N≥K. The K information bit locations are referred to as an information set. An information sequence SN (i.e., a ranking sequence of the information bit locations) is optimized for the specific code length N. The K information bits are mapped to the first K bit locations in the information sequence SN.

In some embodiments, N=1024 and the information sequences SN are any of the sequences a) to oo) listed above.

Optionally, the transmit node 12, and more specifically the transmitter 16, transmits the polar-encoded information bits (step 102). Notably, other optional steps (e.g., rate-matching) may be performed after polar encoding and prior to transmission.

Figure 4B:
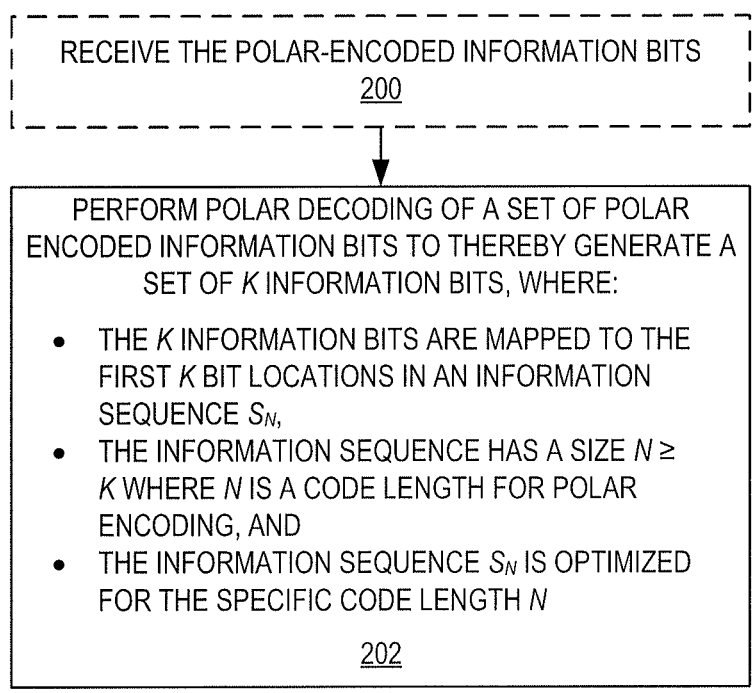
FIG. 4B is a flow chart that illustrates the operation of a receive node in accordance with some embodiments of the present disclosure.

FIG. 4B is a flow chart that illustrates the operation of the receive node 18 in accordance with some embodiments of the present disclosure. Optional steps are represented by a dashed box. As illustrated, the receive node 18, and in particular the polar decoder 20, performs polar decoding of a set of polar encoded information bits to thereby generate a set of K information bits (step 202). The polar encoded bits may have been generated according to step 100 described with respect to FIG. 4A.

Optionally, the receive node 18, and more specifically the receiver 22, receives the polar-encoded information bits (step 200). Notably, other optional steps may be performed after receiving and before polar decoding.

Figure 5:
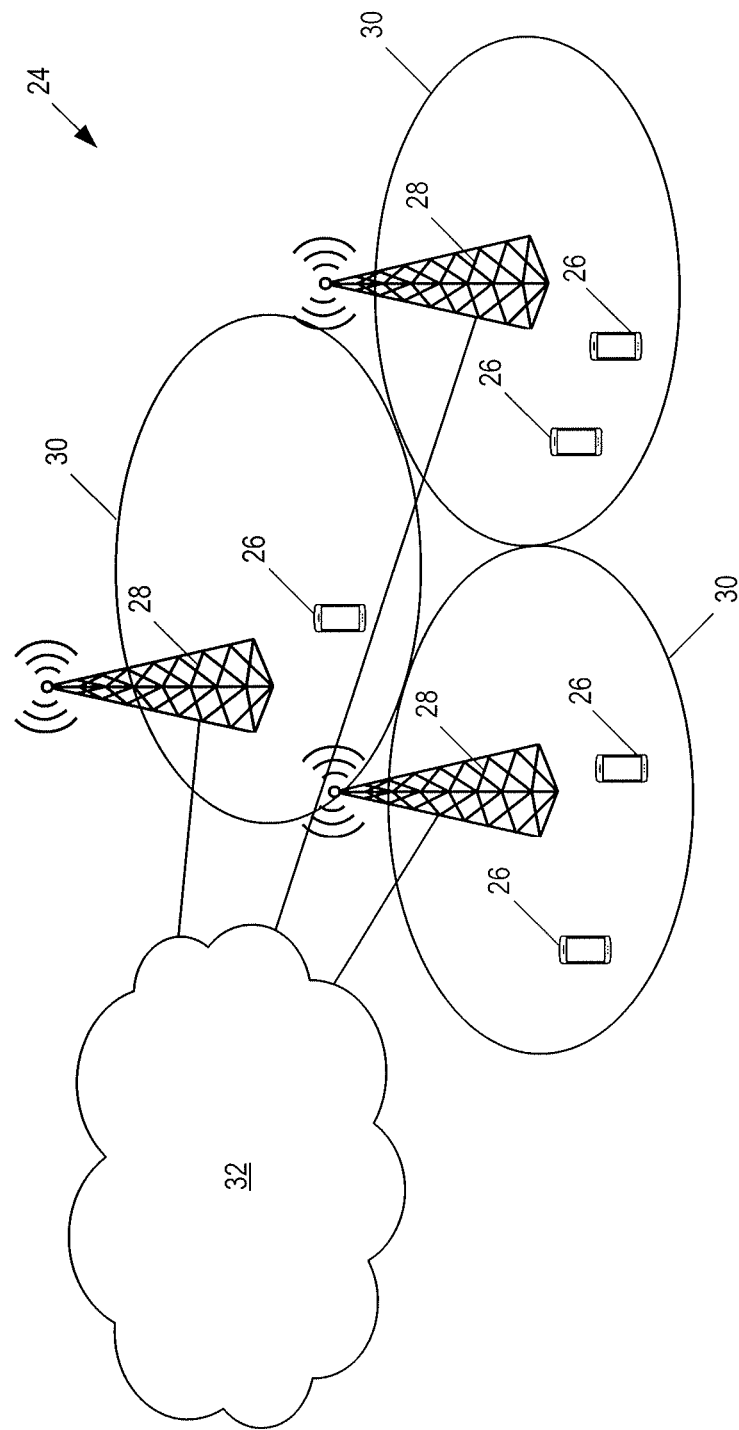
FIG. 5 illustrates one example of a wireless communication system in which embodiments of the present disclosure may be implemented.

FIG. 5 illustrates one example of a wireless communication system 24 in which embodiments of the present disclosure may be implemented. The wireless communication system 24 is preferably a 3GPP 5G NR system, but is not limited thereto. As illustrated, the wireless communication system 24 includes a number of wireless communication devices 26, which are also referred to herein as UEs. In addition, the wireless communication system 24 includes a radio access network that includes a number of radio access nodes 28 (e.g., gNBs) serving corresponding coverage areas or cells 30. The radio access nodes 28 are connected to a core network 32, which includes a number of core network nodes, as will be appreciated by one of skill in the art.

As an example, the radio access node 28 and/or the wireless communication device 26 may operate as the transmit node 12 described above.

Figure 6:
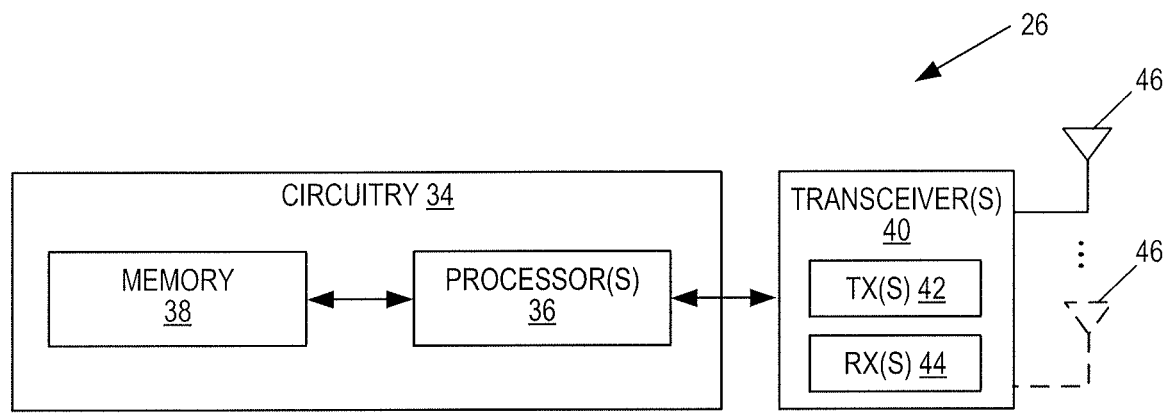
FIGS. 6 and 7 illustrate example embodiments of a wireless communication device.

FIG. 6 is a schematic block diagram of the wireless communication device 26, or UE, according to some embodiments of the present disclosure. As illustrated, the wireless communication device 26 includes circuitry 34 comprising one or more processors 36 (e.g., Central Processing Units (CPUs), Application Specific Integrated Circuits (ASICs), Field Programmable Gate Arrays (FPGAs), Digital Signal Processors (DSPs), and/or the like) and memory 38. The wireless communication device 26 also includes one or more transceivers 40 each including one or more transmitters 42 and one or more receivers 44 coupled to one or more antennas 46. In some embodiments, the functionality of the wireless communication device 26 described herein may be implemented in hardware (e.g., via hardware within the circuitry 34 and/or within the processor(s) 36) or be implemented in a combination of hardware and software (e.g., fully or partially implemented in software that is, e.g., stored in the memory 38 and executed by the processor(s) 36).

In some embodiments, a computer program including instructions which, when executed by the at least one processor 36, causes the at least one processor 36 to carry out at least some of the functionality of the wireless communication device 26 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 7:
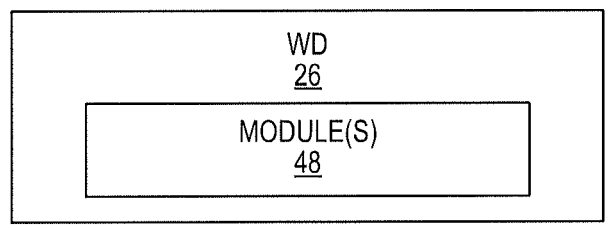

FIG. 7 is a schematic block diagram of the wireless communication device 26, or UE, according to some other embodiments of the present disclosure. The wireless communication device 26 includes one or more modules 48, each of which is implemented in software. The module(s) 48 provide the functionality of the wireless communication device 26, or more specifically the transmit node 12, described herein (e.g., as described with respect to FIGS. 3 and 4).

Figure 8:
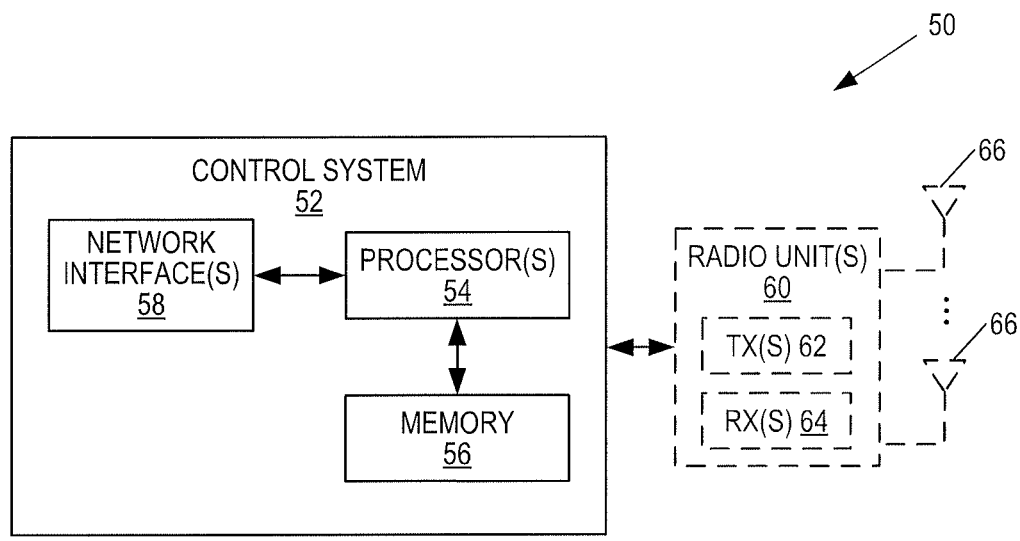
FIGS. 8 through 10 illustrate example embodiments of a network node.

FIG. 8 is a schematic block diagram of a network node 50 (e.g., a radio access node 28 such as, for example, a gNB) according to some embodiments of the present disclosure. As illustrated, the network node 50 includes a control system 52 that includes circuitry comprising one or more processors 54 (e.g., CPUs, ASICs, DSPs, FPGAs, and/or the like) and memory 56. The control system 52 also includes a network interface 58. In embodiments in which the network node 50 is a radio access node 28, the network node 50 also includes one or more radio units 60 that each include one or more transmitters 62 and one or more receivers 64 coupled to one or more antennas 66. In some embodiments, the functionality of the network node 50 (specifically the functionality of the radio access node 28 or transmit node 12) described above may be fully or partially implemented in software that is, e.g., stored in the memory 56 and executed by the processor(s) 54.

Figure 9:
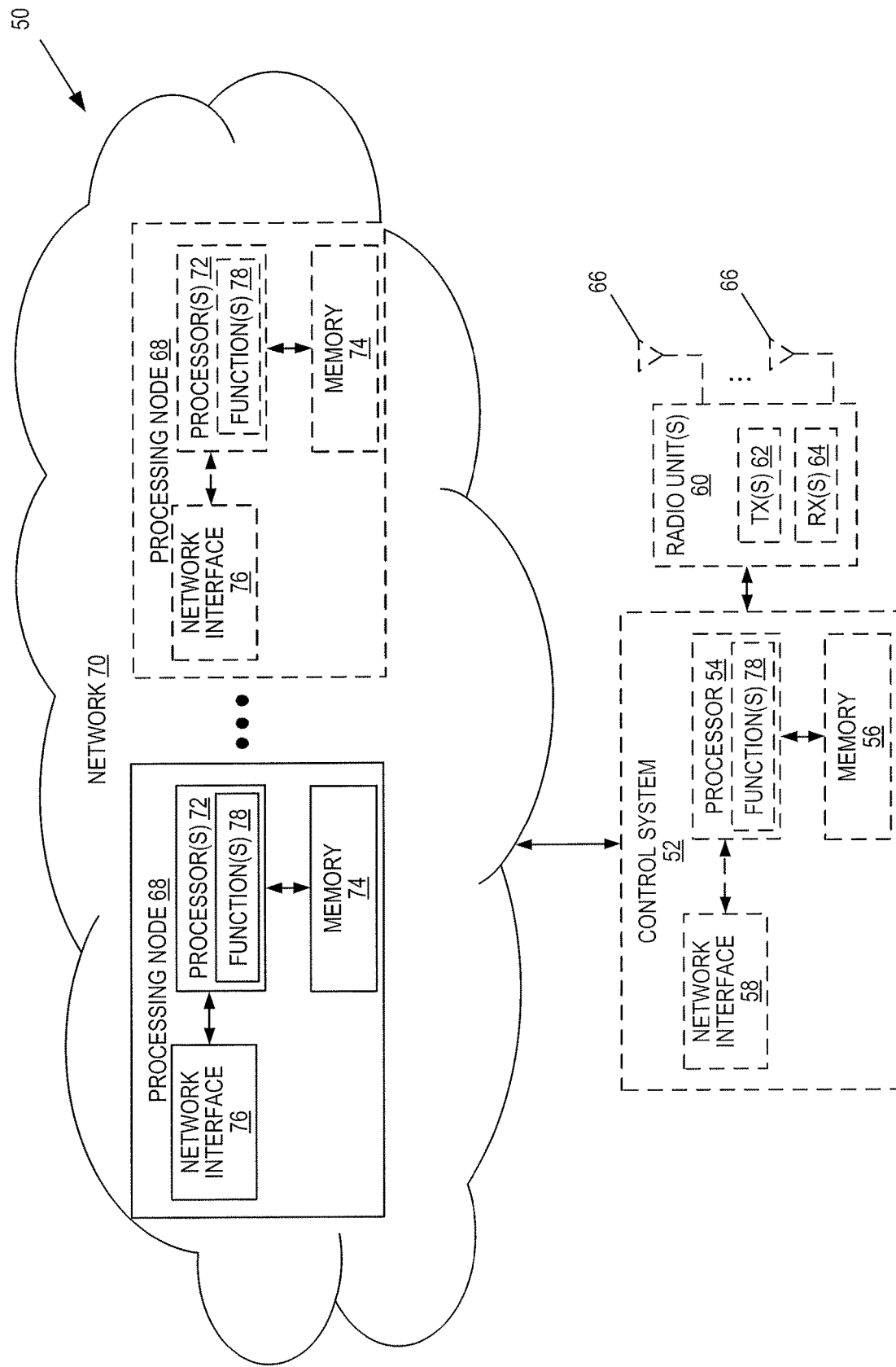

FIG. 9 is a schematic block diagram that illustrates a virtualized embodiment of the network node 50 (e.g., the radio access node 28) according to some embodiments of the present disclosure. As used herein, a "virtualized" network node 50 is a network node 50 in which at least a portion of the functionality of the network node 50 is implemented as a virtual component (e.g., via a virtual machine(s) executing on a physical processing node(s) in a network(s)). As illustrated, the network node 50 optionally includes the control system 52, as described with respect to FIG. 8. In addition, if the network node 50 is the radio access node 28, the network node 50 also includes the one or more radio units 60, as described with respect to FIG. 8. The control system 52 (if present) is connected to one or more processing nodes 68 coupled to or included as part of a network(s) 70 via the network interface 58. Alternatively, if the control system 52 is not present, the one or more radio units 60 (if present) are connected to the one or more processing nodes 68 via a network interface(s). Alternatively, all of the functionality of the network node 50 (e.g., all of the functionality of the radio access node 28) described herein may be implemented in the processing nodes 68. Each processing node 68 includes one or more processors 72 (e.g., CPUs, ASICs, DSPs, FPGAs, and/or the like), memory 74, and a network interface 76.

In this example, functions 78 of the network node 50 (e.g., the functions of the radio access node 28 or transmit node 12) described herein are implemented at the one or more processing nodes 70 or distributed across the control system 52 (if present) and the one or more processing nodes 68 in any desired manner. In some particular embodiments, some or all of the functions 78 of the network node 50 described herein are implemented as virtual components executed by one or more virtual machines implemented in a virtual environment(s) hosted by the processing node(s) 68. As will be appreciated by one of ordinary skill in the art, additional signaling or communication between the processing node(s) 68 and the control system 52 (if present) or alternatively the radio unit(s) 60 (if present) is used in order to carry out at least some of the desired functions. Notably, in some embodiments, the control system 52 may not be included, in which case the radio unit(s) 60 (if present) communicates directly with the processing node(s) 68 via an appropriate network interface(s).

In some particular embodiments, higher layer functionality (e.g., layer 3 and up and possibly some of layer 2 of the protocol stack) of the network node 50 may be implemented at the processing node(s) 68 as virtual components (i.e., implemented "in the cloud") whereas lower layer functionality (e.g., layer 1 and possibly some of layer 2 of the protocol stack) may be implemented in the radio unit(s) 60 and possibly the control system 52.

In some embodiments, a computer program including instructions which, when executed by the at least one processor 54, 72, causes the at least one processor 54, 72 to carry out the functionality of the network node 50 or a processing node 68 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 56, 74).

Figure 10:
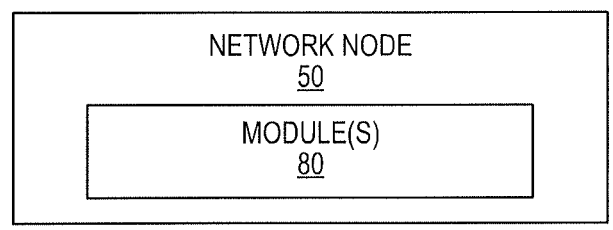

FIG. 10 is a schematic block diagram of the network node 50 (e.g., the radio access node 28) according to some other embodiments of the present disclosure. The network node 50 includes one or more modules 80, each of which is implemented in software. The module(s) 80 provide the functionality of the network node 50 described herein (e.g., the functionality of the transmit node 12 as described herein, e.g., with respect to FIGS. 3 and 4).

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure.

Abbreviations used in the preceding description include:
3GPP Third Generation Partnership Project
5G Fifth Generation
ADC Analog-to-Digital Converter
ASIC Application Specific Integrated Circuit
AWGN Additive White Gaussian Noise
BLER Block Error Rate
CPU Central Processing Unit
CRC Cyclic Redundancy Check
DAC Digital-to-Analog Converter
DSP Digital Signal Processor
eNB Enhanced or Evolved Node B
FPGA Field Programmable Gate Array
gNB New Radio Base Station
LDPC Low-Density Parity-Check
LTE Long Term Evolution
ML Maximum-Likelihood
MME Mobility Management Entity
MTC Machine Type Communication
NR New Radio
P-GW Packet Data Network Gateway
PW Polarization Weight
RX Receive
SC Successive Cancellation
SCEF Service Capability Exposure Function
SCL Successive Cancellation List
TX Transmit
UE User Equipment

The invention claimed is:

1. A method of operation of a transmit node in a wireless communication system, the method comprising:
performing, by a polar encoder, polar encoding of a set of K information bits to thereby generate a set of polar-encoded information bits, wherein:
the K information bits are mapped to first K bit locations in an information sequence $S_N$, the information sequence $S_N$ is a ranked sequence of N information bit locations among a plurality of input bits for the polar encoding, where N is equivalent to a code length;
a size of the information sequence $S_N$ is greater than or equal to K; and
the information sequence $S_N$ is optimized for a specific value of the code length (N), wherein N=1024, and the information sequence $S_N$ is:
$S_{1024}^1$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 501 881 760 743 933 494 921 874 918 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932

635 471 445 742 880 498 730 851 822 382 920 845
741 443 700 729 631 492 872 961 726 821 930 497
381 843 463 916 739 671 623 490 929 439 814 819
868 752 914 698 725 839 856 476 813 718 908 486
723 866 489 607 431 697 379 811 798 913 575 717
254 694 636 474 807 715 906 797 693 865 960 852
744 634 473 795 905 485 415 483 470 444 375 850
740 686 902 824 691 253 711 633 844 685 630 901
367 791 928 728 820 849 783 670 899 738 842 683
251 469 442 441 462 247 737 438 467 351 629 841
724 679 669 496 461 818 380 437 627 622 459 378
239 488 667 838 430 484 812 621 319 817 435 377
696 722 912 606 810 864 716 837 721 714 809 796
455 472 619 835 692 663 223 414 904 429 806 482
632 713 690 848 605 374 252 794 427 710 684 615
805 900 655 468 373 603 413 574 481 371 250 793
466 423 366 689 628 440 365 709 790 803 411 573
682 249 460 789 668 599 350 707 246 681 465 571
626 436 407 782 191 127 363 620 666 458 245 349
678 434 677 591 787 399 457 359 238 625 840 567
736 665 428 376 781 898 618 675 318 454 662 243
897 347 836 816 720 433 604 617 779 808 661 834
712 804 833 559 237 453 426 222 317 775 372 343
412 235 543 614 451 425 422 613 370 221 315 480
335 659 654 364 190 369 248 653 688 231 410 602
611 802 792 421 651 601 598 708 311 219 572 597
788 570 409 590 362 801 680 464 406 419 348 647
786 215 589 706 361 676 566 189 595 244 569 303
405 358 456 346 398 565 242 126 705 780 587 624
664 236 187 357 432 785 558 674 207 403 397 452
345 563 778 241 316 342 616 660 557 125 234 183
287 355 583 673 395 424 314 220 777 341 612 658
123 175 774 555 233 334 542 450 313 391 230 652
368 218 339 600 119 333 657 610 773 541 310 420
159 229 650 551 596 609 408 217 449 188 309 214
331 111 539 360 771 649 302 418 594 896 227 404
646 186 588 832 568 213 417 301 307 356 402 800
564 327 95 206 240 535 593 645 586 344 396 185
401 211 354 299 585 286 562 643 182 205 124 232
285 295 181 556 582 527 394 340 63 203 561 353
704 122 283 393 581 554 174 390 448 312 338 228
179 784 199 553 121 173 389 540 579 332 118 672
550 337 158 279 271 416 216 308 387 538 549 226
330 776 171 212 117 110 329 656 157 772 306 326
225 167 115 537 534 184 109 300 547 305 210 155
533 325 608 352 400 298 204 94 648 284 209 151
180 107 770 297 392 323 592 202 644 93 294 178
103 143 282 62 336 201 120 172 198 769 584 388
293 177 526 278 281 642 525 531 61 170 116 197
87 156 277 114 560 169 59 291 580 275 523 641 270
195 552 519 166 224 578 108 269 79 154 113 548
577 536 328 55 106 165 153 150 386 208 324 546
385 267 47 92 163 304 296 105 102 149 263 532 322
292 545 90 200 31 321 530 142 176 147 101 141 196
524 529 290 89 280 60 86 99 139 168 58 522 276 85
194 289 78 135 112 521 57 83 54 518 274 268 768
164 77 152 193 53 162 104 517 273 266 75 46 148
51 640 100 45 576 161 265 262 71 146 30 140 88
515 98 43 29 261 145 138 84 259 39 97 27 56 82 137
76 384 134 23 52 133 320 15 81 50 74 131 44 73 544
192 528 288 520 160 272 70 49 516 42 69 28 144 41
67 96 514 38 264 260 136 26 22 37 80 513 25 258
35 132 21 257 72 14 48 19 130 68 40 11 512 66 129
7 36 24 34 256 20 65 33 12 128 18 10 17 6 9 64 5
3 32 16 8 4 2 1 0].

2. The method of claim 1, further comprising transmitting the set of polar-encoded information bits.

3. The method of claim 1, wherein the transmit node is a radio access node in the wireless communication system.

4. The method of claim 1, wherein the transmit node is a wireless communication device in the wireless communication system.

5. A transmit node, comprising:
a polar encoder operable to perform polar encoding of a set of K information bits to thereby generate a set of polar-encoded information bits, wherein:
the K information bits are mapped to first K bit locations in an information sequence $S_N$, the information sequence $S_N$ is a ranked sequence of N information bit locations among a plurality of input bits for the polar encoding, where N is equivalent to a code length;
a size of the information sequence $S_N$ is greater than or equal to K; and
the information sequence SN is optimized for a specific value of the code length (N), wherein N=1024, and the information sequence $S_N$ is:
$S_{1024}^1$=[1023 1022 1021 1019 1015 1007 1020 991 1018
1017 1014 1006 959 1013 1011 895 1005 990 1003 989
767 1016 999 1012 987 958 983 957 1010 1004 955
1009 894 975 893 1002 951 1001 988 511 766 998 891
943 986 997 985 887 956 765 995 927 982 981 879 954
974 763 953 979 510 1008 759 863 950 892 1000 973
949 509 890 971 996 942 751 984 889 507 947 831 886
967 941 764 926 980 994 939 885 993 735 878 925 503
762 883 978 935 703 495 952 877 761 972 923 977 948
758 862 875 919 970 757 861 508 969 750 946 479 888
639 871 911 830 940 859 755 966 945 749 506 884 938
965 829 734 924 855 505 747 963 937 882 934 827 733
447 992 847 876 502 922 702 501 881 760 743 933 494
921 874 918 823 731 499 860 756 931 701 873 493 727
917 870 976 815 910 383 968 478 858 754 699 491 869
944 748 638 915 477 719 909 964 255 799 504 857 854
753 828 746 695 487 907 637 867 853 475 936 962 446
732 826 745 846 500 825 903 687 932 635 471 445 742
880 498 730 851 822 382 920 845 741 443 700 729 631
492 872 961 726 821 930 497 381 843 463 916 739 671
623 490 929 439 814 819 868 752 914 698 725 839 856
476 813 718 908 486 723 866 489 607 431 697 379 811
798 913 575 717 254 694 636 474 807 715 906 797 693
865 960 852 744 634 473 795 905 485 415 483 470 444
375 850 740 686 902 824 691 253 711 633 844 685 630
901 367 791 928 728 820 849 783 670 899 738 842 683
251 469 442 441 462 247 737 438 467 351 629 841 724
679 669 496 461 818 380 437 627 622 459 378 239 488
667 838 430 484 812 621 319 817 435 377 696 722 912
606 810 864 716 837 721 714 809 796 455 472 619 835
692 663 223 414 904 429 806 482 632 713 690 848 605
374 252 794 427 710 684 615 805 900 655 468 373 603
413 574 481 371 250 793 466 423 366 689 628 440 365
709 790 803 411 573 682 249 460 789 668 599 350 707
246 681 465 571 626 436 407 782 191 127 363 620 666
458 245 349 678 434 677 591 787 399 457 359 238 625
840 567 736 665 428 376 781 898 618 675 318 454 662
243 897 347 836 816 720 433 604 617 779 808 661 834
712 804 833 559 237 453 426 222 317 775 372 343 412
235 543 614 451 425 422 613 370 221 315 480 335 659
654 364 190 369 248 653 688 231 410 602 611 802 792
421 651 601 598 708 311 219 572 597 788 570 409 590
362 801 680 464 406 419 348 647 786 215 589 706 361
676 566 189 595 244 569 303 405 358 456 346 398 565
242 126 705 780 587 624 664 236 187 357 432 785 558
674 207 403 397 452 345 563 778 241 316 342 616 660
557 125 234 183 287 355 583 673 395 424 314 220 777
341 612 658 123 175 774 555 233 334 542 450 313 391

230 652 368 218 339 600 119 333 657 610 773 541 310 420 159 229 650 551 596 609 408 217 449 188 309 214 331 111 539 360 771 649 302 418 594 896 227 404 646 186 588 832 568 213 417 301 307 356 402 800 564 327 95 206 240 535 593 645 586 344 396 185 401 211 354 299 585 286 562 643 182 205 124 232 285 295 181 556 582 527 394 340 63 203 561 353 704 122 283 393 581 554 174 390 448 312 338 228 179 784 199 553 121 173 389 540 579 332 118 672 550 337 158 279 271 416 216 308 387 538 549 226 330 776 171 212 117 110 329 656 157 772 306 326 225 167 115 537 534 184 109 300 547 305 210 155 533 325 608 352 400 298 204 94 648 284 209 151 180 107 770 297 392 323 592 202 644 93 294 178 103 143 282 62 336 201 120 172 198 769 584 388 293 177 526 278 281 642 525 531 61 170 116 197 87 156 277 114 560 169 59 291 580 275 523 641 270 195 552 519 166 224 578 108 269 79 154 113 548 577 536 328 55 106 165 153 150 386 208 324 546 385 267 47 92 163 304 296 105 102 149 263 532 322 292 545 90 200 31 321 530 142 176 147 101 141 196 524 529 290 89 280 60 86 99 139 168 58 522 276 85 194 289 78 135 112 521 57 83 54 518 274 268 768 164 77 152 193 53 162 104 517 273 266 75 46 148 51 640 100 45 576 161 265 262 71 146 30 140 88 515 98 43 29 261 145 138 84 259 39 97 27 56 82 137 76 384 134 23 52 133 320 15 81 50 74 131 44 73 544 192 528 288 520 160 272 70 49 516 42 69 28 144 41 67 96 514 38 264 260 136 26 22 37 80 513 25 258 35 132 21 257 72 14 48 19 130 68 40 11 512 66 129 7 36 24 34 256 20 65 33 12 128 18 10 17 6 9 64 5 3 32 16 8 4 2 1 0].

6. The transmit node of claim 5, further comprising a transmitter operable to transmit the set of polar-encoded information bits.

7. A network node comprising one or more modules operable to perform a method of:
performing, by a polar encoder, polar encoding of a set of K information bits to thereby generate a set of polar-encoded information bits, wherein:
the K information bits are mapped to first K bit locations in an information sequence $S_N$, the information sequence $S_N$ is a ranked sequence of N information bit locations among a plurality of input bits for the polar encoding, where N is equivalent to a code length;
a size of the information sequence $S_N$ is greater than or equal to K; and
the information sequence $S_N$ is optimized for a specific value of the code length (N), wherein N=1024, and the information sequence $S_N$ is:

$S_{1024}^1$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 501 881 760 743 933 494 921 874 918 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932 635 471 445 742 880 498 730 851 822 382 920 845 741 443 700 729 631 492 872 961 726 821 930 497 381 843 463 916 739 671 623 490 929 439 814 819 868 752 914 698 725 839 856 476 813 718 908 486 723 866 489 607 431 697 379 811 798 913 575 717 254 694 636 474 807 715 906 797 693 865 960 852 744 634 473 795 905 485 415 483 470 444 375 850 740 686 902 824 691 253 711 633 844 685 630 901 367 791 928 728 820 849 783 670 899 738 842 683 251 469 442 441 462 247 737 438 467 351 629 841 724 679 669 496 461 818 380 437 627 622 459 378 239 488 667 838 430 484 812 621 319 817 435 377 696 722 912 606 810 864 716 837 721 714 809 796 455 472 619 835 692 663 223 414 904 429 806 482 632 713 690 848 605 374 252 794 427 710 684 615 805 900 655 468 373 603 413 574 481 371 250 793 466 423 366 689 628 440 365 709 790 803 411 573 682 249 460 789 668 599 350 707 246 681 465 571 626 436 407 782 191 127 363 620 666 458 245 349 678 434 677 591 787 399 457 359 238 625 840 567 736 665 428 376 781 898 618 675 318 454 662 243 897 347 836 816 720 433 604 617 779 808 661 834 712 804 833 559 237 453 426 222 317 775 372 343 412 235 543 614 451 425 422 613 370 221 315 480 335 659 654 364 190 369 248 653 688 231 410 602 611 802 792 421 651 601 598 708 311 219 572 597 788 570 409 590 362 801 680 464 406 419 348 647 786 215 589 706 361 676 566 189 595 244 569 303 405 358 456 346 398 565 242 126 705 780 587 624 664 236 187 357 432 785 558 674 207 403 397 452 345 563 778 241 316 342 616 660 557 125 234 183 287 355 583 673 395 424 314 220 777 341 612 658 123 175 774 555 233 334 542 450 313 391 230 652 368 218 339 600 119 333 657 610 773 541 310 420 159 229 650 551 596 609 408 217 449 188 309 214 331 111 539 360 771 649 302 418 594 896 227 404 646 186 588 832 568 213 417 301 307 356 402 800 564 327 95 206 240 535 593 645 586 344 396 185 401 211 354 299 585 286 562 643 182 205 124 232 285 295 181 556 582 527 394 340 63 203 561 353 704 122 283 393 581 554 174 390 448 312 338 228 179 784 199 553 121 173 389 540 579 332 118 672 550 337 158 279 271 416 216 308 387 538 549 226 330 776 171 212 117 110 329 656 157 772 306 326 225 167 115 537 534 184 109 300 547 305 210 155 533 325 608 352 400 298 204 94 648 284 209 151 180 107 770 297 392 323 592 202 644 93 294 178 103 143 282 62 336 201 120 172 198 769 584 388 293 177 526 278 281 642 525 531 61 170 116 197 87 156 277 114 560 169 59 291 580 275 523 641 270 195 552 519 166 224 578 108 269 79 154 113 548 577 536 328 55 106 165 153 150 386 208 324 546 385 267 47 92 163 304 296 105 102 149 263 532 322 292 545 90 200 31 321 530 142 176 147 101 141 196 524 529 290 89 280 60 86 99 139 168 58 522 276 85 194 289 78 135 112 521 57 83 54 518 274 268 768 164 77 152 193 53 162 104 517 273 266 75 46 148 51 640 100 45 576 161 265 262 71 146 30 140 88 515 98 43 29 261 145 138 84 259 39 97 27 56 82 137 76 384 134 23 52 133 320 15 81 50 74 131 44 73 544 192 528 288 520 160 272 70 49 516 42 69 28 144 41 67 96 514 38 264 260 136 26 22 37 80 513 25 258 35 132 21 257 72 14 48 19 130 68 40 11 512 66 129 7 36 24 34 256 20 65 33 12 128 18 10 17 6 9 64 5 3 32 16 8 4 2 1 0].

8. A method of operation of a receive node in a wireless communication system, the method comprising:
performing, by a polar decoder, polar decoding of a set of polar encoded information bits to thereby generate a set of K information bits, wherein:
the K information bits are mapped to first K bit locations in an information sequence $S_N$, the information sequence $S_N$ is a ranked sequence of N information bit locations among a plurality of input bits for polar encoding where N is equivalent to a code length;
a size of the information sequence $S_N$ is greater than or equal to K; and
the information sequence SN is optimized for a specific value of the code length (N), wherein N=1024, and the information sequence SN is:
$S_{1024}^1$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 501 881 760 743 933 494 921 874 918 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932 635 471 445 742 880 498 730 851 822 382 920 845 741 443 700 729 631 492 872 961 726 821 930 497 381 843 463 916 739 671 623 490 929 439 814 819 868 752 914 698 725 839 856 476 813 718 908 486 723 866 489 607 431 697 379 811 798 913 575 717 254 694 636 474 807 715 906 797 693 865 960 852 744 634 473 795 905 485 415 483 470 444 375 850 740 686 902 824 691 253 711 633 844 685 630 901 367 791 928 728 820 849 783 670 899 738 842 683 251 469 442 441 462 247 737 438 467 351 629 841 724 679 669 496 461 818 380 437 627 622 459 378 239 488 667 838 430 484 812 621 319 817 435 377 696 722 912 606 810 864 716 837 721 714 809 796 455 472 619 835 692 663 223 414 904 429 806 482 632 713 690 848 605 374 252 794 427 710 684 615 805 900 655 468 373 603 413 574 481 371 250 793 466 423 366 689 628 440 365 709 790 803 411 573 682 249 460 789 668 599 350 707 246 681 465 571 626 436 407 782 191 127 363 620 666 458 245 349 678 434 677 591 787 399 457 359 238 625 840 567 736 665 428 376 781 898 618 675 318 454 662 243 897 347 836 816 720 433 604 617 779 808 661 834 712 804 833 559 237 453 426 222 317 775 372 343 412 235 543 614 451 425 422 613 370 221 315 480 335 659 654 364 190 369 248 653 688 231 410 602 611 802 792 421 651 601 598 708 311 219 572 597 788 570 409 590 362 801 680 464 406 419 348 647 786 215 589 706 361 676 566 189 595 244 569 303 405 358 456 346 398 565 242 126 705 780 587 624 664 236 187 357 432 785 558 674 207 403 397 452 345 563 778 241 316 342 616 660 557 125 234 183 287 355 583 673 395 424 314 220 777 341 612 658 123 175 774 555 233 334 542 450 313 391 230 652 368 218 339 600 119 333 657 610 773 541 310 420 159 229 650 551 596 609 408 217 449 188 309 214 331 111 539 360 771 649 302 418 594 896 227 404 646 186 588 832 568 213 417 301 307 356 402 800 564 327 95 206 240 535 593 645 586 344 396 185 401 211 354 299 585 286 562 643 182 205 124 232 285 295 181 556 582 527 394 340 63 203 561 353 704 122 283 393 581 554 174 390 448 312 338 228 179 784 199 553 121 173 389 540 579 332 118 672 550 337 158 279 271 416 216 308 387 538 549 226 330 776 171 212 117 110 329 656 157 772 306 326 225 167 115 537 534 184 109 300 547 305 210 155 533 325 608 352 400 298 204 94 648 284 209 151 180 107 770 297 392 323 592 202 644 93 294 178 103 143 282 62 336 201 120 172 198 769 584 388 293 177 526 278 281 642 525 531 61 170 116 197 87 156 277 114 560 169 59 291 580 275 523 641 270 195 552 519 166 224 578 108 269 79 154 113 548 577 536 328 55 106 165 153 150 386 208 324 546 385 267 47 92 163 304 296 105 102 149 263 532 322 292 545 90 200 31 321 530 142 176 147 101 141 196 524 529 290 89 280 60 86 99 139 168 58 522 276 85 194 289 78 135 112 521 57 83 54 518 274 268 768 164 77 152 193 53 162 104 517 273 266 75 46 148 51 640 100 45 576 161 265 262 71 146 30 140 88 515 98 43 29 261 145 138 84 259 39 97 27 56 82 137 76 384 134 23 52 133 320 15 81 50 74 131 44 73 544 192 528 288 520 160 272 70 49 516 42 69 28 144 41 67 96 514 38 264 260 136 26 22 37 80 513 25 258 35 132 21 257 72 14 48 19 130 68 40 11 512 66 129 7 36 24 34 256 20 65 33 12 128 18 10 17 6 9 64 5 3 32 16 8 4 2 1 0].

9. The method of claim 8, further comprising receiving the set of polar-encoded information bits.

10. The method of claim 8, wherein the receive node is a radio access node in the wireless communication system.

11. The method of claim 8, wherein the receive node is a wireless communication device in the wireless communication system.

12. A receive node, comprising:
a polar decoder operable to perform polar decoding of a set of polar encoded information bits to thereby generate a set of K information bits, wherein:
the K information bits are mapped to first K bit locations in an information sequence $S_N$, the information sequence $S_N$ is a ranked sequence of N information bit locations among a plurality of input bits for polar encoding where N is equivalent to a code length;
a size of the information sequence $S_N$ is greater than or equal to K; and
the information sequence $S_N$ is optimized for a specific value of the code length (N), wherein N=1024, and the information sequence SN is:
$S_{1024}^1$=[1023 1022 1021 1019 1015 1007 1020 991 1018 1017 1014 1006 959 1013 1011 895 1005 990 1003 989 767 1016 999 1012 987 958 983 957 1010 1004 955 1009 894 975 893 1002 951 1001 988 511 766 998 891 943 986 997 985 887 956 765 995 927 982 981 879 954 974 763 953 979 510 1008 759 863 950 892 1000 973 949 509 890 971 996 942 751 984 889 507 947 831 886 967 941 764 926 980 994 939 885 993 735 878 925 503 762 883 978 935 703 495 952 877 761 972 923 977 948 758 862 875 919 970 757 861 508 969 750 946 479 888 639 871 911 830 940 859 755 966 945 749 506 884 938 965 829 734 924 855 505 747 963 937 882 934 827 733 447 992 847 876 502 922 702 501 881 760 743 933 494 921 874 918 823 731 499 860 756 931 701 873 493 727 917 870 976 815 910 383 968 478 858 754 699 491 869 944 748 638 915 477 719 909 964 255 799 504 857 854 753 828 746 695 487 907 637 867 853 475 936 962 446 732 826 745 846 500 825 903 687 932 635 471 445 742 880 498 730 851 822 382 920 845

741 443 700 729 631 492 872 961 726 821 930 497
381 843 463 916 739 671 623 490 929 439 814 819
868 752 914 698 725 839 856 476 813 718 908 486
723 866 489 607 431 697 379 811 798 913 575 717
254 694 636 474 807 715 906 797 693 865 960 852
744 634 473 795 905 485 415 483 470 444 375 850
740 686 902 824 691 253 711 633 844 685 630 901
367 791 928 728 820 849 783 670 899 738 842 683
251 469 442 441 462 247 737 438 467 351 629 841
724 679 669 496 461 818 380 437 627 622 459 378
239 488 667 838 430 484 812 621 319 817 435 377
696 722 912 606 810 864 716 837 721 714 809 796
455 472 619 835 692 663 223 414 904 429 806 482
632 713 690 848 605 374 252 794 427 710 684 615
805 900 655 468 373 603 413 574 481 371 250 793
466 423 366 689 628 440 365 709 790 803 411 573
682 249 460 789 668 599 350 707 246 681 465 571
626 436 407 782 191 127 363 620 666 458 245 349
678 434 677 591 787 399 457 359 238 625 840 567
736 665 428 376 781 898 618 675 318 454 662 243
897 347 836 816 720 433 604 617 779 808 661 834
712 804 833 559 237 453 426 222 317 775 372 343
412 235 543 614 451 425 422 613 370 221 315 480
335 659 654 364 190 369 248 653 688 231 410 602
611 802 792 421 651 601 598 708 311 219 572 597
788 570 409 590 362 801 680 464 406 419 348 647
786 215 589 706 361 676 566 189 595 244 569 303
405 358 456 346 398 565 242 126 705 780 587 624
664 236 187 357 432 785 558 674 207 403 397 452
345 563 778 241 316 342 616 660 557 125 234 183
287 355 583 673 395 424 314 220 777 341 612 658
123 175 774 555 233 334 542 450 313 391 230 652
368 218 339 600 119 333 657 610 773 541 310 420
159 229 650 551 596 609 408 217 449 188 309 214
331 111 539 360 771 649 302 418 594 896 227 404
646 186 588 832 568 213 417 301 307 356 402 800
564 327 95 206 240 535 593 645 586 344 396 185
401 211 354 299 585 286 562 643 182 205 124 232
285 295 181 556 582 527 394 340 63 203 561 353
704 122 283 393 581 554 174 390 448 312 338 228
179 784 199 553 121 173 389 540 579 332 118 672
550 337 158 279 271 416 216 308 387 538 549 226
330 776 171 212 117 110 329 656 157 772 306 326
225 167 115 537 534 184 109 300 547 305 210 155
533 325 608 352 400 298 204 94 648 284 209 151
180 107 770 297 392 323 592 202 644 93 294 178
103 143 282 62 336 201 120 172 198 769 584 388
293 177 526 278 281 642 525 531 61 170 116 197
87 156 277 114 560 169 59 291 580 275 523 641 270
195 552 519 166 224 578 108 269 79 154 113 548
577 536 328 55 106 165 153 150 386 208 324 546
385 267 47 92 163 304 296 105 102 149 263 532 322
292 545 90 200 31 321 530 142 176 147 101 141 196
524 529 290 89 280 60 86 99 139 168 58 522 276 85
194 289 78 135 112 521 57 83 54 518 274 268 768
164 77 152 193 53 162 104 517 273 266 75 46 148
51 640 100 45 576 161 265 262 71 146 30 140 88
515 98 43 29 261 145 138 84 259 39 97 27 56 82 137
76 384 134 23 52 133 320 15 81 50 74 131 44 73 544
192 528 288 520 160 272 70 49 516 42 69 28 144 41
67 96 514 38 264 260 136 26 22 37 80 513 25 258
35 132 21 257 72 14 48 19 130 68 40 11 512 66 129
7 36 24 34 256 20 65 33 12 128 18 10 17 6 9 64 5
3 32 16 8 4 2 1 0].

13. The receive node of claim 12, further comprising a receiver operable to receive the set of polar-encoded information bits.

14. The receive node of claim 12, wherein the receive node is a radio access node in a wireless communication system.

15. The receive node of claim 12, wherein the receive node is a wireless communication device in a wireless communication system.

* * * * *